(12) United States Patent
Na

(10) Patent No.: US 9,046,771 B2
(45) Date of Patent: Jun. 2, 2015

(54) PHOTOSENSITIVE COMPOSITION FOR DISPLAY DEVICE, BLACK MATRIX HAVING THE COMPOSITION, AND METHOD OF FORMING BLACK MATRIX USING THE COMPOSITION

(71) Applicant: LG Display Co., Ltd., Seoul (KR)

(72) Inventor: Youn-Sung Na, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/096,502

(22) Filed: Dec. 4, 2013

(65) Prior Publication Data

US 2014/0162178 A1    Jun. 12, 2014

(30) Foreign Application Priority Data

Dec. 10, 2012 (KR) ........................ 10-2012-0142882

(51) Int. Cl.
*G03F 7/028* (2006.01)
*G02B 5/20* (2006.01)
*G03F 7/038* (2006.01)
*G03F 7/40* (2006.01)
*G02B 5/22* (2006.01)
*G03F 7/00* (2006.01)

(52) U.S. Cl.
CPC *G03F 7/038* (2013.01); *G03F 7/40* (2013.01); *G02B 5/223* (2013.01); *G03F 7/0007* (2013.01); *G03F 7/028* (2013.01)

(58) Field of Classification Search
CPC ....... G03F 7/0007; G03F 7/028; G03F 7/038; G03F 7/40; G02B 5/201; G02B 5/22; G02B 5/223; G02F 1/133512; G02F 1/133514; G02F 1/133516; G02F 1/136209
USPC .......................... 430/7, 270.1, 281.1; 349/110
See application file for complete search history.

(56) References Cited

U.S. PATENT DOCUMENTS

2012/0176456 A1* 7/2012 Maekawa et al. ............. 347/102
2014/0231729 A1* 8/2014 Shiota et al. .................. 252/586

FOREIGN PATENT DOCUMENTS

| KR | 10-2008-0067816 A | 7/2008 |
| KR | 10-2012-0078495 A | 7/2012 |
| WO | 2012/091401 A2 | 7/2012 |
| WO | WO 2012/176694 A1 * | 12/2012 |

* cited by examiner

*Primary Examiner* — John A McPherson
(74) *Attorney, Agent, or Firm* — Morgan, Lewis & Bockius LLP

(57) ABSTRACT

There is provided a photosensitive composition for forming a black matrix including pigment of 5~20 wt %; binder resin of 1~25 wt %; photo-polymerizable monomer of 1~25 wt %; photopolymerization initiator of 1~25 wt %; solvent of 65~85 wt %; and photo base generator of 1~10 wt %, based on 100 parts by weight of the photosensitive composition.

16 Claims, 4 Drawing Sheets

PHOTOSENSITIVE COMPOSITION FOR DISPLAY DEVICE, BLACK MATRIX HAVING THE COMPOSITION, AND METHOD OF FORMING BLACK MATRIX USING THE COMPOSITION

The present application claims the priority benefit of Korean Patent Application No. 10-2012-0142882 filed in the Republic of Korea on Dec. 10, 2012, which is hereby incorporated by reference in its entirety.

BACKGROUND

1. Field of the Disclosure

The present disclosure relates to a photosensitive composition for a display device, and more particularly, to a photosensitive composition for a black matrix of a liquid crystal display device, a black matrix having the composition, and a method of forming a black matrix using the composition.

2. Discussion of the Related Art

With focus of attention to display devices that are slim and portable, various flat panel display devices have replaced cathode ray tubes (CRTs). Among the flat panel display devices, liquid crystal display (LCD) devices have been widely used for monitors of personal computers, televisions, cellular phones or navigation systems due to their low power consumption, slimness, low manufacturing costs, and superior contacts with integrated circuits.

Since an LCD device including thin film transistors as a switching element, referred to as an active matrix LCD (AM-LCD) device and controlling on and off of each pixel, has excellent characteristics of high resolution and displaying moving images, the AM-LCD device has been widely used.

An LCD device includes an array substrate, a color filter substrate and a liquid crystal layer interposed therebetween. The LCD device is generally fabricated by performing processes of manufacturing the array substrate including thin film transistors and pixel electrodes, manufacturing the color filter substrate including color filter patterns and a common electrode, and interposing a liquid crystal layer between the substrates.

More particularly, in the array substrate, gate lines and data lines defining pixel regions are formed on a substrate. A thin film transistor is formed at each crossing portion of the gate and data lines, and a pixel electrode in each pixel region is connected to the thin film transistor. In the color filter substrate, a black matrix of a lattice shape including openings is formed on a substrate and surrounds edges of each pixel region to shield non-display areas of the array substrate. A color filter layer is formed in each opening of the black matrix and includes red, green and blue color filter patterns, which are sequentially arranged to correspond to respective pixel regions. A transparent common electrode is formed all over the black matrix and the color filter layer. The common electrode may be formed over the substrate of the array substrate.

An aperture ratio of each pixel region of the LCD device is affected by the black matrix. That is, to display images of high definition and high contrast ratio, the black matrix having a highly light-shielding property needs to be formed between the pixel regions of the red, green and blue color filter patterns. The black matrix is first formed when the color filter substrate is manufactured, and in the non-display areas, the black matrix blocks light from a backlight incident on a liquid crystal panel to thereby increase the contrast ratio.

Thus, the black matrix is required to prevent mixing of colors in three color pixel regions including the color filter patterns and to optically separate the pixel regions. Specially, in the AM-LCD device including thin film transistors, the black matrix needs to have a high light-blocking property. In addition, the black matrix separates the red, green and blue color filter patterns and blocks light going onto a channel of the thin film transistor to thereby prevent light leakage due to the light.

Generally, the black matrix is formed on a surface of the substrate by performing coating, light-exposing, developing and baking steps. Namely, a black matrix layer is formed on the substrate of the color filter substrate by applying a photosensitive composition in a predetermined thickness. Then, desired patterns are formed by performing a photolithography process that includes a light-exposing step using a photo mask for an appropriate critical dimension and a developing step. The patterns may be cured in an oven through a hard-baking step, thereby forming the black matrix on the substrate. The black matrix shields the non-display areas.

The black matrix may be formed of chromium. Since the black matrix of chromium has high reflectance, there are problems that lowering display qualities is caused and environmental pollution occurs. To solve the problems, various methods of dyeing, printing, electrodeposition, and pigment dispersion have been introduced, and the pigment dispersion method has been widely used. In the pigment dispersion method, a photopolymerizable composition including a colored pigment is coated on a transparent substrate and is exposed to light, developed and cured, thereby forming patterns of a black matrix.

By the way, to display images of high definition and excellent qualities, it is needed to reduce widths of patterns of the black matrix and improve transmittance and visibility. Especially, to develop an LCD device having 4.5 high definition (1280*720, 330 ppi) beyond those of WVGA and 2VGA, the patterns of the black matrix should have the widths less than 6 micrometers.

To do this, it is considered to decrease a pattern width of the photo mask used in a light-exposing step. However, if only the pattern width is simply decreased, the black matrix layer may not be sufficiently exposed to light because the intensity of light passing through a light-transmitting portion of the photo mask is weakened. Particularly, a lower portion of the black matrix layer is not exposed to light and is not chemically changed.

Therefore, when the black matrix layer is developed, sides of the lower portion of the black matrix layer are excessively removed, and an undercut shape is formed. The patterns of the black matrix have cross-sections of a trapezoidal shape not a rectangular shape due to the undercut shape.

Another solution is to form fine patterns of the black matrix by decreasing a distance between a light source and the black matrix layer and maintaining the intensity of light. By the way, in edge areas of the substrate, an expected amount of light is not irradiated due to interference because light is scattered and diffracted. In addition, with a large size of a substrate, the photo mask also has an increased size, and a central portion of the photo mask sags downwards as compared with side portions of the photo mask. This causes a difference in distances between the substrate and the portions of the photo mask, that is, light-exposing gaps, and the light intensities sectionally differ. Accordingly, since light is not sufficiently irradiated to and is not sufficiently hardened at the edge areas of the substrate, the black matrix layer may be excessively damaged at the edge areas by the developing solution.

Simply reducing the pattern width of the photo mask or decreasing the distance between the light source and the black matrix layer may cause some cuts, loss or taper damages of the patterns of the black matrix formed at the edge areas of the substrate. Moreover, the undercut shape is formed in the black matrix, and it is difficult to obtain uniform fine patterns all over the substrate.

Another solution is to increase developing time after the light-exposing step. However, this increases manufacturing time and lowers the productivity. In addition, patterns at the edge areas may be further damaged.

SUMMARY OF THE INVENTION

Accordingly, the present invention is directed to a photosensitive composition for a black matrix of a liquid crystal display device, a black matrix having the composition, and a method of forming a black matrix using the composition that substantially obviate one or more of the problems due to limitations and disadvantages of the related art.

An object of the present disclosure is to provide a photosensitive composition for a black matrix of a liquid crystal display device, a black matrix having the composition, and a method of forming a black matrix using the composition that increase the aperture ratio and obtain high definition and image quality due to a fine pattern of the black matrix.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a photosensitive composition for forming a black matrix including pigment of 5~20 wt %; binder resin of 1~25 wt %; photo-polymerizable monomer of 1~25 wt %; photopolymerization initiator of 1~25 wt %; solvent of 65~85 wt %; and photo base generator of 1~10 wt %, based on 100 parts by weight of the photosensitive composition.

In another aspect, a method of forming a black matrix including forming a film by applying a photosensitive composition to a substrate, wherein the photosensitive composition includes pigment of 5~20 wt %, binder resin of 1~25 wt %, photo-polymerizable monomer of 1~25 wt %, photopolymerization initiator of 1~25 wt %, solvent of 65~85 wt %, and photo base generator of 1~10 wt %, based on 100 parts by weight of the photosensitive composition; disposing a photo mask over the film and irradiating light to the film through the photo mask such that a photo-polymer is formed; developing the film including the photo-polymer using a developing solution to form a pattern; and baking the pattern.

In another aspect, a method of fabricating a color filter substrate includes forming a film by applying a photosensitive composition to a substrate, wherein the photosensitive composition includes pigment of 5~20 wt %, binder resin of 1~25 wt %, photo-polymerizable monomer of 1~25 wt %, photopolymerization initiator of 1~25 wt %, solvent of 65~85 wt %, and photo base generator of 1~10 wt %, based on 100 parts by weight of the photosensitive composition; disposing a photo mask over the film and irradiating light to the film through the photo mask such that a photo-polymer is formed; developing the film including the photo-polymer using a developing solution to form a pattern; baking the pattern to form a black matrix; and forming a color filter layer on the substrate exposed by the black matrix.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
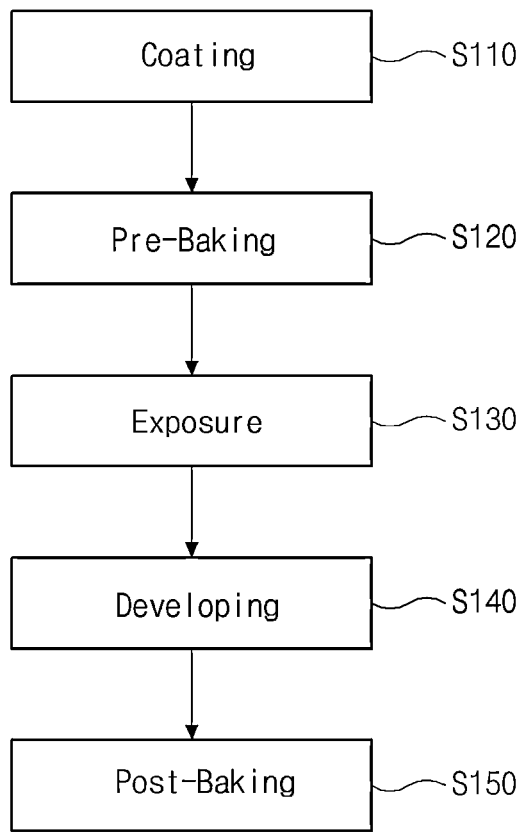
FIG. 1 is a block diagram of schematically illustrating steps of forming a black matrix of a liquid crystal display device using a photosensitive composition according to an embodiment of the present invention.

Reference will now be made in detail to the preferred embodiments, examples of which are illustrated in the accompanying drawings.

A composition of the present invention includes a compound which generates an amine group when light is irradiated thereto, and a pattern formed of the composition is prevented from being damaged by alkali developing solution at its upper and side portions. Thus, a black matrix formed of the composition can include patterns with fine widths.

A. Photosensitive Composition

A composition for a black matrix according to a first aspect of the present invention includes a photo base generator, which is decomposed by light to generate amine. The black matrix may be formed on a substrate by a pigment dispersion method, for example.

The composition for a black matrix of the present invention may include a pigment of 5~20 wt %, a binder resin of 1~25 wt %, a photo-polymerizable monomer of 1~25 wt %, a photopolymerization initiator of 1~25 wt %, a solvent of 65~85 wt %, and a photo base generator of 1~10 wt %.

The pigment is to fulfill a light-blocking function of the black matrix. The pigment includes a black-colored pigment such as carbon black. Here, the carbon black may be used alone, or the carbon black may be used in combination with other pigments. The other pigments may include a black pigment such as titanium black, acetylene black, aniline black, perylene black and cyanine black or a color compensator such as carmine 6B, phthalocyanine blue, azo pigment, strontium titanate and chromium oxide.

The pigment may be contained in the composition in an amount of 5~20 wt % based on 100 parts by weight of the photosensitive composition, beneficially, 5~15 wt %. If the content of the pigment is less than the above-mentioned amount, it is difficult to achieve a sufficient light-blocking effect and/or an expected optical density. If the content of the pigment is more than the above-mentioned amount, viscosity of the composition increases, thereby lowering security in patterns or adhesion to the substrate. The pigment may be mixed with a solvent or a dispersant and may be used in form of millbase or dispersion. The pigment may include particles having an average size of 20~50 nm so that the pigment may be properly dispersed to form fine patterns of the black matrix.

The binder resin of the photosensitive composition according to the present invention, which functions as a support, forms a matrix material as a result of reaction with light in a light-exposing step. The binder resin may include an acrylic binder resin, which is able to control pattern flowability of the black matrix finally formed and generates a suitable binder by introducing a variety of monomers, and/or a cardo binder resin, which is able to control pattern developability depending on changes in acid value.

More particularly, the acrylic binder resin may include an alkali-soluble acrylic binder resin, which is soluble in the developing solution. Beneficially, the acrylic binder resin may include a copolymer resulting from copolymerizing a monomer containing an acid functional group and another monomer copolymerizable with the monomer. A film from the copolymer may be much stronger than that from a homopolymer. It is beneficial that the acrylic binder resin includes fluorine such that a cured film has a hydrophobic property.

In this case, an alkali-soluble acrylic binder resin may be used alone. Alternatively, a binder resin containing an epoxy group having a ring structure, which may be referred to as an epoxy binder resin, may be used with the acrylic binder resin to improve alkali resistance of the cured film.

Meanwhile, a cardo binder resin, which facilitates the control of pattern developability depending on changes in acid value and exhibits pigment affinity and high sensitivity, may be used in addition to the alkali-soluble acrylic binder resin. The cardo binder resin is an acrylate-based binder resin that has a main chain containing halogen such as fluorine. For example, the cardo binder resin may include a compound represented by chemical formula 1 or chemical formula 2 of Korean Patent Publication No. 10-2008-0067816 or chemical formula 1 of Korean Patent Publication No. 10-2012-0078495.

The binder resin contained in the photosensitive composition of the present invention, beneficially, may have the acid value of 50 to 300 mg KOH/g. If the acid value is less than 50 mg KOH/g, the composition has low solubility to the alkali developing solution. Thus, the developing time gets longer, and residues remain on the substrate. If the acid value is more than 300 mg KOH/g, there occurs desorption of patterns, and it is difficult to obtain pattern linearity.

Moreover, it is preferable that the binder resin has a weight-average molecular weight of 1,000~200,000. If the weight-average molecular weight of the binder resin is less than 1,000, bonds between components are weakened, and patterns are disappeared in a developing step. On the other hand, if the weight-average molecular weight exceeds 200,000, the composition is not almost developed by the alkali developing solution, and efficiency of the developing step is decreased. In addition, the flowability becomes worse, and it is hard to form patterns having a uniform thickness.

The alkali-soluble acrylic binder resin and/or the cardo binder resin, which function as a support of the film formed of the photosensitive composition, may be contained in an amount of 1~25 wt % based on 100 parts by weight of the photosensitive composition, and beneficially, 3~10 wt %. If the content of the binder resin is less than the amount, coatability of the pigment may be decreased. If the content of the binder resin exceeds the amount, the cured film may not have the desired optical properties. For instance, when the cardo binder resin is used, the content of the binder resin should be in a range of the above-mentioned amount to achieve hydrophobic property, developability, coatability and dispersion stability of the film.

The photo-polymerizable monomer is photo-polymerized by radicals generated from the photopolymerization initiator by light in the light-exposing step to thereby form a photopolymer. Therefore, the photo-polymerizable monomer may be a monomer that is polymerized into a binder resin by a radical reaction due to irradiation of light. Or the photo-polymerizable monomer may be a monomer of a photopolymer copolymerizable with a binder resin. For example, when the binder resin is the alkali-soluble acrylic binder resin, a monomer containing an acid functional group and another monomer copolymerizable with the monomer may be used as the photo-polymerizable monomer. The monomer containing an acid functional group may include but not be limited to acrylic acid, methacrylic acid, crotonic acid, itaconic acid, maleic acid, fumaric acid, monomethyl maleic acid, isoprene sulfonic acid or styrene sulfonic acid. These may be used alone or in mixtures of two or more.

As stated above, the alkali-soluble acrylic binder resin may contain a fluorine functional group to exhibit hydrophobicity at a surface of the cured film. Thus, an acrylic monomer used to prepare the alkali-soluble acrylic binder resin also may contain a fluorine functional group. The acrylic monomer containing a fluorine functional group may be copolymerizable with other monomers. The acrylic monomer containing a fluorine functional group has at least one carbon double bond. The acrylic monomer containing a fluorine functional group may be $CH_2\!=\!CHC(O)OCHCH_2(CF_2)_xCF_3$, wherein x is an integer of 1 to 15. The amount of the monomer containing a fluorine functional group may be adjusted depending on the amount of fluorine contained in the monomer. It is beneficial that the amount of fluorine contained in the alkali-soluble acrylic binder is 5~40 wt % such that developability, coatability and dispersion stability does not deteriorate.

Meanwhile, when the binder resin is the cardo binder resin, an acrylic monomer and/or an acrylate monomer introducing a fluorine functional group thereto may be used as the photo-polymerizable monomer. For example, the photo-polymerizable monomer may be an acrylate monomer unsubstituted or substituted with a saturated or unsaturated aliphatic or aromatic group. The substituted group may be fluorine-substituted C3~C30 alkyl, aryl, alkyl-aryl or aryl-alkyl. The introduction of the fluorine functional group and a compound facilitating the introduction for hydrophobicity of the cardo binder resin are not limited.

Moreover, the photo-polymerizable monomer may include a functional monomer containing an ethylenic-unsaturated double bond that is polymerizable with the acrylic monomer containing an acid functional group or the monomer of the cardo binder resin mentioned above. The functional monomer containing an ethylenic-unsaturated double bond, beneficially, may include a multi-functional monomer containing an ethylenic-unsaturated double bond, and such a monomer may form a matrix material by irradiation of light.

Non-limiting examples of the functional monomer containing an ethylenic-unsaturated double bond include a mono-functional monomer such as ethylene glycol monoacrylate, ethylene glycol monomethacrylate, propylene glycol monoacrylate, propylene glycol monomethacrylate, phenoxyethyl acrylate and phenoxyethyl methacrylate, ethylene glycol diacrylate, triethylene glycol diacrylate, 1,4-butanediol diacrylate, 1,4-butanediol dimethacrylate, 1,6-hexanediol diacrylate, 1,6-hexanediol dimethacrylate, ethylene glycol dimethacrylate, triethylene glycol dimethacrylate, propylene glycol dimethacrylate, pentaerythritol diacrylate, pentaerythritol triacrylate, pentaerythritol trimethacrylate, pentaerythritol tetramethacrylate, dipentaerythritol diacrylate, dipentaerythritol triacrylate, dipentaerythritol pentaacrylate, dipentaerythritol hexaacrylate, dipentaerythritol hexamethacrylate, dipentaerythritol acrylate, neopentyl glycol diacrylate, tetraethylene glycol methacrylate, bis-phenoxy ethyl alcohol diacrylate, tris hydroxy ethyl isocyanurate, tri-methylol propane triacrylate, and trimethyl propane trimethacrylate, and one or more selected from them can be used. Preferably, pentaerythritol triacrylate, dipentaerythritol pentaacrylate or dipentaerythritol hexaacrylate can be used.

In addition, to increase alkali resistance of in the cured film, an ethylenic-unsaturated monomer containing a cyclic epoxy group can be used. For example, the monomer containing the epoxy group may be polymerizable with the monomer containing the acid functional group and/or the functional monomer containing the ethylenic-unsaturated double bond mentioned above.

Non-limiting examples of the monomer containing the epoxy group, i.e., epoxy group monomer, include glycidyl acrylate, glycidyl methacrylate, glycidyl α-ethyl acrylate, glycidyl n-propyl acrylate, 3,4-epoxy butyl acrylate, 3,4-epoxy butyl methacrylate, 6,7-epoxy heptyl acrylate, 6,7-epoxy heptyl methacrylate and vinyl benzyl glycidyl ether. Preferably, some epoxy group monomers containing a fluorine functional group can be used to increase hydrophobicity at a surface of a black matrix.

The photo-polymerizable monomer of the present invention may be contained in the composition in an amount of 1~25 wt % based on 100 parts by weight of the photosensitive composition, beneficially, 3~10 wt %. If the content of the photo-polymerizable monomer is within the above-mentioned amount, the pattern may be formed and the bondability with the pigment may be increased by a cross-linked bond formed by a radical reaction of a photo initiator with UV light. For instance, if the content of the photo-polymerizable monomer is less than the above-mentioned amount, the film may be excessively developed, and the cured film may not be clear. If the content of the photo-polymerizable monomer is more than the above-mentioned amount, the film may not be developed.

The photopolymerization initiator in the photosensitive composition of the present invention may form radicals by light irradiated during a light-exposing step using a photo mask and function as an initiator for polymerization of the photo-polymerizable monomer. Therefore, while photopolymerization occurs in a region of the film exposed to light and the photo-polymerizable monomer is cured, photopolymerization does not occur in a region of the film not exposed to light and the photo-polymerizable monomer is not cured.

The photopolymerization initiator includes any photopolymerization initiator that is able to form radicals by light irradiated in a photolithography process. For example, acetophenone compounds, benzophenone compounds, thioxanthone compounds, benzoin compounds, triazine compounds, and oxime compounds can be used as the photopolymerization initiator. The photopolymerization initiator for the photosensitive composition of the present invention is not limited. Beneficially, triazine compounds or oxime compounds, which have good developability to an alkaline solution used as the developing solution and excellent sensitivity with respect to the same exposure, may be used.

Examples of acetophenone compounds used as the photopolymerization initiator include 2,2'-diethoxy acetophenone, 2,2'-dibuthoxy acetophenone, 2-hydroxy-2-methylpropiophenone, p-tert-butyl trichloro acetophenone, p-tert-butyl dichloro acetophenone, 4-choloro acetophenone, 2,2'-dichloro-4-phenoxy acetophenone, 2-methyl-1-(4-(methylthio)phenyl)-2-morpholino-1-one, 1,2-octanedione-1-[4-(phenylthio)phenyl]-2-(o-benzoyloxime), and 2-benzyl-2-dimethylamino-1-(4-morpholinophenyl)-butane-1-one.

Examples of benzophenone compounds used as the photopolymerization initiator include benzophenone, 4,4'-dimethylamino benzophenone, 4,4'-dichlro benzophenone, 3,3'-dimethyl-2-methoxylbenzophenone, benzoyl benzoate, benzoyl methyl benzoate, 4-phenyl benzophenone, hydroxy benzophenone, acrylated benzophenone, 4,4'-bis(dimethyl amino)benzophenone, and 4,4,'-bis(diethyl amino)benzophenone.

Examples of thioxanthone compounds used as the photopolymerization initiator include thioxanthone, 2-chrol thioxanthone, 2-methyl thioxanthone, isopropyl thioxanthone, 1-[9-ethyl-6-(2-methyl benzoyl)-9H-carbazole-3,3-yl]-1-(o-acetyl oxime), 2,4-diethyl thioxanthone, 2,4-diisopropyl thioxanthone, and 2-choloro thioxanthone.

Examples of benzoin compounds used as the photopolymerization initiator include benzoin, benzoin methyl ether, benzoin ethyl ether, benzoin isopropyl ether, benzoin isobutyl ether, and benzyl dimethyl ketal.

Examples of triazine compounds used as the photopolymerization initiator include 4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-nitrile)-4,6-bis(trichloro methyl)-s-triazine, 2-biphenyl-4,6-bis(trichloro methyl)-s-triazine, bis(trichloro methyl)-6-styryl-s-triazine, 2-(naphtho-1-yl)-4,6-bis(trichloro methyl)-s-triazine, 2-(4-methoxy naphtho-1-yl)-4,6-bis(trichloro methyl)-s-triazine, 2,4-trichloro methyl(piperonyl)-6-triazine, and 2,4-trichloro methyl(4'-methoxy styryl)-6-triazine.

Examples of oxime compounds used as the photopolymerization initiator include 1-[9-ethyl-6-(2-methyl benzoyl)-9H-carbazole-3-yl]-1-(O-acetyl oxime) ethanone (CGI-242) and 1-[4-(phenyl thiol)phenyl]-2-(O-benzoyl oxime)-1,2-octanedione (CGI-124) (Ciba, Japan) and further include oxime A or oxime E of an oxime ester compound (Kotem, Japan).

Besides, carbazole-based compounds, diketone compounds, sulfonium borate-based compounds, diazo-based compounds, and biimidazole-based compounds may be used as the photopolymerization initiator of the photosensitive composition according to the present invention.

The photopolymerization initiator of the present invention may be contained in an amount of 1~25 wt % based on 100 parts by weight of the photosensitive composition, and beneficially, 2~10 wt %. If the content of the photopolymerization initiator is less than the amount, photopolymerization does not sufficiently occur, and it is difficult to stably form patterns of the black matrix. If the content of the photopolymerization initiator is more than the amount, the solubility to the developing solution is lowered, and widths of the patterns of the black matrix increase. Thus, it is hard to form fine patterns of the black matrix.

Meanwhile, the photosensitive composition of the present invention further includes the photo base generator (PBG), which is decomposed by light to thereby generate a base. Preferably, the photo base generator of the present invention may be decomposed by light to thereby generate free amine, and such a photo base generator may have a structure of a carbamate derivative. For example, the photo base generator may be a carbamate derivative having a structure of the following chemical formula.

chemical formula

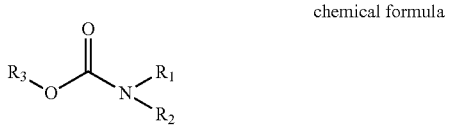

Here, each of R1, R2 and R3 may be one of C1~C10 alkyl having a hetero atom; C3~C8 cyclo aliphatic having a hetero atom on a ring; and aryl having a hetero atom on a ring. The aryl may be unsubstituted or substituted with C1~C10 alkyl or C1~C10 alkoxy such as benzene, phenyl, naphthalene or anthracene. For example, in the chemical formula, the hetero atom may be an oxygen atom, a nitrogen atom and/or a sulfur atom.

Beneficially, each of R1, R2 and R3 may be the aryl unsubstituted or substituted with C1~C10 alkyl or C1~C10 alkoxy such as benzene, phenyl, naphthalene or anthracene. In this case, one or more oxygen, nitrogen and/or sulfur atoms may be contained on the aryl ring.

For instance, the photo base generator expressed by the chemical formula is decomposed by light to thereby generate photo-cleavable moiety and basic amine as shown in the following reaction formula.

reaction formula

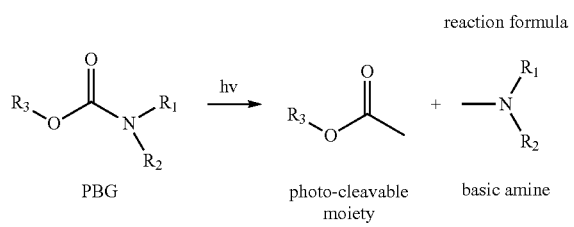

PBG          photo-cleavable     basic amine
                 moiety

Therefore, the photo base generator is not decomposed and remains intact in the region of the film not exposed to light, and the photo base generator dissolves in alkali aqueous solution, which is used as developing solution. On the other hand, the photo base generator is decomposed to thereby generate basic amine in the region of the film exposed to light. The basic amine does not react with the alkali aqueous solution, and a pattern of the film is prevented from being damaged by the developing solution.

The photo base generator may be contained in the composition in an amount of 1~10 wt % based on 100 parts by weight of the photosensitive composition, beneficially, 2~8 wt %. If the content of the photo base generator is not within the above-mentioned amount, the photosensitive composition may have too high resistance to the developing solution, and residues may remain on the substrate.

The photosensitive composition further includes the solvent in addition to the above-mentioned solid components to control the viscosity of the photosensitive composition. Examples of the solvent include propylene glycol methyl ether acetate (PGMEA), propylene glycol ethyl ether acetate (PGEEA), propylene glycol methyl ether (PGME), propylene glycol propyl ether (PGPE), ethylene glycol monomethyl ether acetate, ethylene glycol monoethyl ether acetate, ethylene glycol monobutyl ether acetate, ethylene glycol monomethyl ether, ethylene glycol monoethyl ether, diethylene glycol methyl acetate, dipropylene glycol methyl ether, methyl ethoxy propionate, ethyl ethoxy propionate, ethyl acetate, butyl acetate, cyclo-hexanone, acetone, methyl isobutyl ketone, dimethyl formamide, N,N'-dimethyl acetamide, N-methylpyrrolidone, toluene, and their combinations. The solvent may be contained in an amount of 65~85 wt % based on 100 parts by weight of the photosensitive composition considering the viscosity and dispersibility of the photosensitive composition such that the photosensitive composition may be properly dispersed on the substrate.

In the meantime, the photosensitive composition may contain a nonionic dispersant, a cationic dispersant or an anionic dispersant as a dispersant for dispersing the pigment. Specifically, examples of the dispersant include polyalkylene glycol and ester thereof, alkylene oxide and alcohol alkylene oxide adducts of polyoxyalkylene polyhydric alcohol ester, sulfonic ester, carboxylic ester, carboxylate salt, and alkyl amine. The solvent may be contained in an amount of less than 1 wt % based on 100 parts by weight of the photosensitive composition, for example, 0.1~0.9 wt %.

Besides, the photosensitive composition may contain various additives to improve its functions. The photosensitive composition may contain at least one additive selected from surfactants for improve coating stability, coupling agents (adhesion accelerators) for improving adhesion between the substrate and the photosensitive composition applied thereon, antioxidants, curing agents, UV absorbents, thermal polymerization inhibitors, and leveling agents.

Examples of the surfactants include cationic surfactants such as organosiloxane polymers, (meth)acrylic copolymers (POLYFLOW), or poly-oxyethylene alkyl amine; non-ionic surfactants including poly-oxyethylene ether or ester of fatty acid such as poly-oxyethylene lauryl ether, poly-oxyethylene stearyl ether, poly-oxyethylene oleyl ether, poly-oxyethylene octyl phenyl ether, or poly-oxyethylene nonyl phenyl ether, and polyhydric alcohol fatty acid ester such as polyethylene glycol dilaurate, polyethylene glycol distearate, sorbitan fatty acid ester; alky phosphate anionic surfactants; and fluorosurfactants.

Examples of the coupling agents include vinyl trialkoxy silane, 3-methacryloxy propyl trimethoxy silane, N-(2-aminoethyl)-3-aminoproyl methyl dimethoxy silane, 3-aminoproyl triethoxy silane, and 3-glycidoxy propyl triethoxy silane. Examples of the antioxidants include 2-2-thiobis(4-methyl-6-tert-butyl phenol) and 2,6-g,6-butyl phenol. Non-limiting examples of the curing agent include 2-mercapt benzoimidazole, 2-mercapto benzothiazole, and pentaerythritol-tetrakis(3-mercapto propionate). Non-limiting examples of the UV absorbents include 2-(3-t-butyl-5-methyl-2-hydroxy phenyl)-5-chloro-benzotriazole and alkoxy benzophenone. Examples of the thermal polymerization inhibitors include hydroquinone, p-methoxy phenol, t-butyl catechol, and benzoquinone. A micro amount of the additives may be effective, and the additives may be preferably contained in an amount of less than 1 wt % based on 100 parts by weight of the photosensitive composition, and beneficially, 0.01~0.5 wt %.

B. A Method of Forming a Black Matrix

Figure 2A:
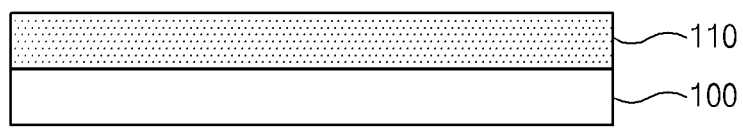
FIGS. 2A to 2C are cross-sectional views of schematically illustrating a substrate including a black matrix of a liquid crystal display device in steps of forming the black matrix.
Figure 2B:
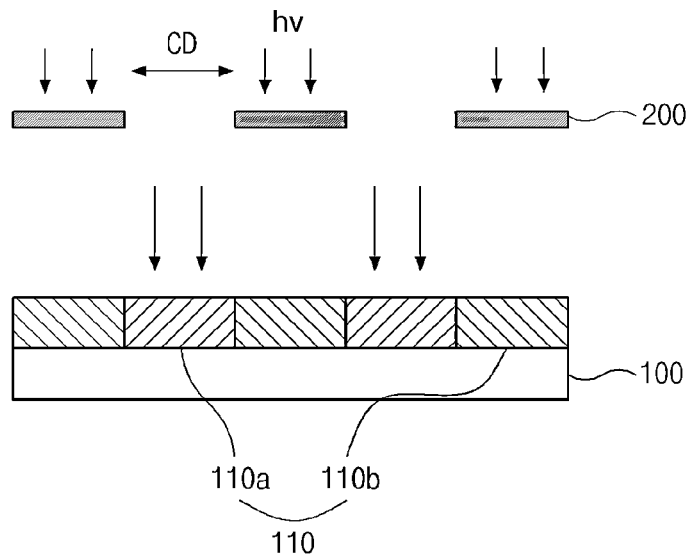
Figure 2C:
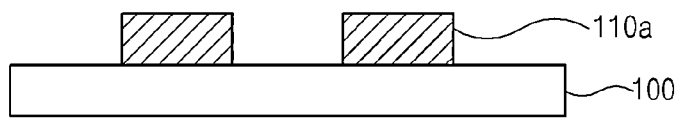

A method of forming a black matrix using the above-mentioned photosensitive composition according to the present invention will be described with reference to accompanying drawings. FIG. 1 is a block diagram of schematically illustrating steps of forming a black matrix of a liquid crystal display device using a photosensitive composition according to an embodiment of the present invention. FIGS. 2A to 2C are cross-sectional views of schematically illustrating a substrate including a black matrix of a liquid crystal display device in steps of forming the black matrix.

In step S110 of FIG. 1 and FIG. 2A, a photosensitive composition of the present invention is applied on a transparent substrate 100, thereby forming a film 110 that has a thickness of 0.5 to 10 micrometers. A method of applying the photosensitive composition is not limited, and the method may be a dip-coating, spin coating, roller coating, spray coating, bar coating or slit coating method.

The substrate 100 may be formed of polyester, aromatic polyamide, polyamide-imide, polyimide, triacetyl cellulose (TAC), polycarbonate (PC), polyether sulfone (PES), polyethylene terephtalate (PET), polyethylene naphthalate (PEN), polyvinyl alcohol (PVA), polymethyl methacrylate (PMMA), or cyclo-olefin polymer (COP) in addition to glass. The substrate 100 may be post-treated by a method such as chemical treatment using silane coupling agent, plasma treatment, ion plating, sputtering, vapor-phase reaction method or evaporation according to purposes.

A pre-baking step S120 of FIG. 1, if necessary, may be carried out at a temperature of 80 to 130 degrees of Celsius, preferably, 90 to 110 degrees, for 80 to 120 seconds, preferably, 90 to 110 seconds, to allow the film 110 to be relatively hardened before performing a light-exposing step. The pre-baking may be referred to as a soft-baking, drying, or pre-curing step. While the solid components of the photosensitive composition of the present invention are not pyrolyzed in the pre-baking step, most of the solvent is vaporized, and the concentration of the solvent is minimized.

A light-exposing step S130 of FIG. 1 and FIG. 2B, beneficially, is performed after the pre-baking step S120 of FIG. 1 to form a black matrix. To perform the light-exposing step, a photo mask 200 is disposed over the substrate 100 on which the film 110 is formed. The film 100 on the substrate 100 is divided into an exposure portion 110a exposed to light and a unexposure portion 110b non-exposed to light. Non-limiting examples of a light source used in the light-exposing step include vapor arc, carbon (C) arc and xenon (Xe) arc.

At this time, the film 110 formed of the photosensitive composition of the present invention may be a negative type. In this case, the photo-polymerizable monomer in the exposure portion 110a of the film 110 may be photo-polymerized by a radical reaction from a photo initiator reacting with light. The photo-polymerizable monomer in the unexposure portion 110b of the film 110 may not be photo-polymerized and remain as monomers because the unexposure portion 110b is not exposed to light and there is no reaction.

That is, in the exposure portion 110a, the photopolymerization initiator contained in the photosensitive composition is activated due to irradiation of light to generate radicals, and the radicals function as a polymerization initiator. Thus, the photo-polymerizable monomer contained in the photosensitive composition is polymerized, and photo-polymer is formed.

Meanwhile, the light source in the light-exposing step S130 may be UV light having a wavelength of 200~400 nm, preferably, 300~400 nm and is not limited on this. A critical dimension (CD) of the exposure portion 110a for a pattern finally formed may be 5~20 micrometers, beneficially, 5~10 micrometers and is not limited on this. A light-exposing gap, which is a distance between the light source and the film 110, may be 100~150 micrometers.

Figure 3:
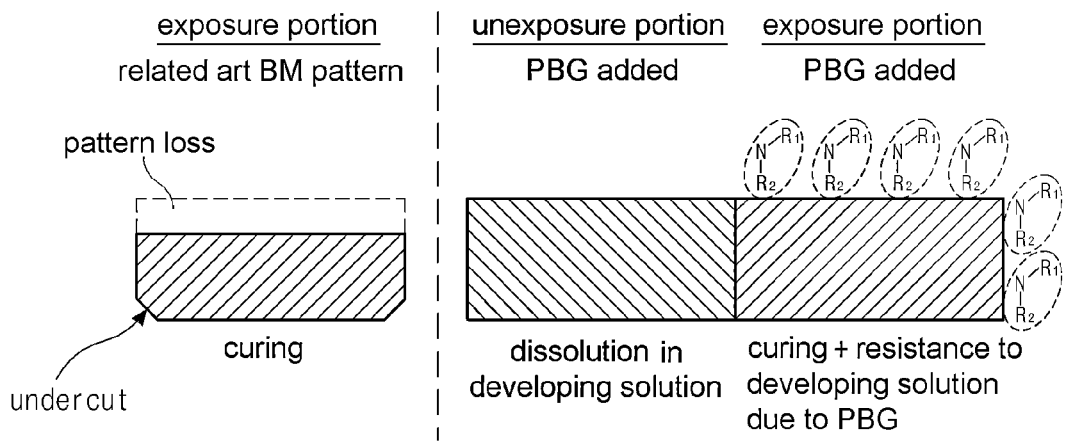
FIG. 3 is a view of illustrating patterns using the photosensitive compositions of the related art and the present invention after a developing steps.

The photosensitive composition includes a photo base generator, which is decomposed by light. Therefore, as shown in FIG. 3, the photo base generator (PBG) is not decomposed and remains in the unexposure portion. Since the photo base generator dissolves well in alkali aqueous solution used as the developing solution, the unexposure portion of the film is removed in a following developing step even if the photo base generator remains in the unexposure portion of the film.

On the other hand, the photo base generator in the exposure portion is decomposed by light to thereby generate photo-cleavable moiety and basic amine as shown in the above-mentioned reaction formula. In addition, as stated above, the photo-polymerizable monomer and the binder resin contained in the photosensitive composition of the present invention may include a hydrophobic fluorine functional group to increase adhesion to the substrate. Since most of the solvent is vaporized in the pre-baking step S120 of FIG. 1, the hydrophobic binder resin and the photo-polymer generated from the hydrophobic photo-polymerizable monomer may constitute most of the exposure portion 110a of the film 110 after the light-exposing step S130 of FIG. 1.

The basic amine generated from the photo base generator has a hydrophilic property. Thus, the hydrophilic basic amine is concentrated in a region far from the photo-polymer and the binder resin having the hydrophobic property, that is, at an outer area such as a top surface or a side surface of the film.

Since the basic amine generated as the result of the photo-decomposition in the light-exposing step is concentrated in the outer area of the film, the basic amine at the surfaces may show resistance to the alkali aqueous solution reacting with the film even if the alkali aqueous solution used in the following developing step contacts the exposure portion of the film. Namely, the basic amine concentrated in the outer area of the exposure portion of the film functions as a protection layer for the film and prevents the film from being damaged by the developing solution. Therefore, in the present invention, even though patterns of the black matrix have a fine width, the patterns of the black matrix may not be damaged, and thus the patterns having a fine width may be uniformly formed all over the substrate.

That is, when a fine pattern having a width of less than 6 micrometers is formed using the photosensitive composition of the present invention, problems such as loss of an upper portion of the pattern or a decrease in a thickness of the pattern are not caused at central and edge areas of the substrate. Thus, the black matrix can be uniformly formed all over the substrate, and high definition and image quality can be obtained due to improvement of the aperture ratio and transmittance.

On the other hand, the photosensitive composition of the related art does not include amine, the developing solution of the basic aqueous solution reacts with the exposure portion of the film, and the film is damaged. Therefore, as shown in the left part of FIG. 3, when the black matrix is formed using the related art photosensitive composition, the upper portion of the pattern of the black matrix may be lost or sides of the lower portion of the pattern of the black matrix may be collapsed to cause undercut, and the pattern may has a trapezoidal shape.

Particularly, the patterns of the black matrix at the edge area of the substrate where exposure energy is not relatively sufficient are likely to be lost at its upper portion and to be collapsed at the sides of its lower portion, and the patterns of the black matrix are not uniformly formed all over the substrate. The fine patterns cannot be formed. Accordingly, in the related art, there is difference in transmittance between areas of the substrate, and it is difficult to obtain high definition and image quality.

After the light-exposing step S130 of FIG. 1, a developing step S140 of FIG. 1 and FIG. 2C is performed to develop the film 110 including the exposure portion 110a and the unexposure portion 110b using a developing solution. In the developing step S140, the unexposure portion 110b of the film 110 including the photo-polymerizable monomer and the photo base generator, which are not exposed to light and remain intact, reacts with the developing solution to form chloride and dissolves in the developing solution.

On the other hand, the exposure portion 110a of the film 110 including the photo-polymer formed by irradiation of light is not developed by the developing solution. Particularly, since the basic amine, which is concentrated at the surfaces of the exposure portion 110a of the film 110, functions as a protection layer, the exposure portion 110a of the film 110 is prevented from being damaged by the developing solution. After the developing step S140, patterns corresponding to the exposure portion 110a of the film 110 are formed on the substrate 100 as shown in FIG. 2C, and the patterns 110a become the black matrix.

At this time, the unexposure portion 110b of the film 110 is removed by the developing solution, and the substrate 100 is exposed in correspondence with the unexposure portion 110b of the film 110. When a color filter layer is formed by an inkjet method later, ink is injected in the exposed area of the substrate 100, and the exposed area of the substrate 100 is a pixel region.

Generally, organic solvent or alkali solution may be used as the developing solution. The organic solvent may cause atmospheric pollution and may be harmful to the human body, and it is desirable to use the alkali solution as the developing solution. Examples of the developing solution include, as an alkali aqueous solution, which may mainly use potassium hydroxide (KOH), inorganic alkali such as sodium hydroxide (NaOH), sodium silicate, sodium metasilicate, and ammonia; primary amines such as ethylamine, and N-propylamine; secondary amines such as diethylamine, and di-n-propylamine; tertiary amines such as trimethylamine, methyldiethylamine, and dimethylethylamine; cyclic tertiary amines such as pyrrol, piperidine, n-methylpiperidine, n-methylpyrrolidine, and 1,8-diazabicyclo[5,4,0]-7-undecene; aromatic tertiary amines such as pyridine, collidine, and quinoline; and quaternary ammonium salts such as tetramethylammoniumhydroxide and tetraethylammoniumhydroxide.

If necessary, organic solvent such as methanol and ethanol or surfactant may be added to the developing solution. Examples of the developing method include a shower developing method, a spray developing method, a dipping developing method and a paddle developing method. For example, the developing step S140 may be performed for 50 to 150 seconds. A rinsing step may be further included to remove the developing solution remaining on the patterns 110a and the substrate 100.

Next, a post-baking step S150 is performed using a heating means at a predetermined temperature to cause cross-linking reaction and to cure the patterns 110a. In the post-baking step S150, the substrate 100 including the patterns 110a may be disposed on a hot-plate or in an oven. After the post-baking step S150, the patterns 110a have the improvements in crack resistance and solvent resistance. The post-baking may be referred to as hard-baking or curing. The post-baking step S150 may be carried out at a temperature of 200~250 degrees of Celsius for 10~30 minutes.

C. A Method of Forming a Black Matrix, a Color Filter Layer and a Color Filter Substrate The present invention relates to a black matrix formed of the above-mentioned photosensitive composition, a color filter layer on the black matrix, and a color filter substrate including the black matrix and the color filter layer.

The black matrix includes the patterns which are formed on the substrate through the steps mentioned above. The black matrix substantially includes the pigment, the photo-polymer, the photopolymerization initiator, the basic amine and the photo-cleavable moiety because the solvent is evaporated and the photo-polymerizable monomer is polymerized. Namely, the photo-polymer is formed by polymerization reaction of the photo-polymerizable monomer by the photopolymerization initiator.

The color filter layer is formed on the substrate including the black matrix. The color filter layer includes red, green and blue color filter patterns. The color filter layer may be formed by a photolithography process similarly to the black matrix or may be formed by an inkjet printing method.

When the color filter layer is formed by the photolithography process, color resist including one of red, green and blue pigments is applied to the substrate, and a color filter pattern is formed in the pixel region between the patterns of the black matrix through light-exposing, developing and curing (baking) steps. Alternatively, when the color filter layer is formed by the inkjet printing method, one of red, green and blue inks is injected into the pixel region between the patterns of the black matrix to thereby form the color filter pattern.

A transparent conductive material such as indium tin oxide (ITO) or indium zinc oxide (IZO) is deposited on substantially an entire surface of the substrate including the black matrix and the color filter layer, thereby forming a common electrode in a twisted nematic (TN) mode. An overcoat layer may be further formed between the color filter layer and the common electrode to protect the color filter layer and compensate steps due to lower layers. Accordingly, the color filter substrate is completed.

A liquid crystal display device according to the present invention includes the color filter substrate including the black matrix and the color filter layer formed by the above-stated method, an array substrate alternatively referred to as a thin film transistor substrate and opposite to the color filter substrate, and a liquid crystal layer interposed between the color filter substrate and the array substrate. Here, the array substrate may include a transparent substrate, thin film transistors and pixel electrodes.

Hereinafter, examples of the embodiment of the present invention will be described in detail, and the present invention is not limited on the examples.

SYNTHESIZING EXAMPLE

Preparation of Photosensitive Composition for Black Matrix

The photosensitive composition for the black matrix was obtained by mixing and stirring at room temperatures carbon black (average diameter 27 nm, Kotem) of 9 wt % as the pigment, oxime E (Kotem) of 2 wt % as the oxime ester photopolymerization initiator, mixture of pentaerythritol tetramethacrylate and dipentaerythritol hexaacyrlate of 3 wt % as the photo-polymerizable monomer, the cardo binder resin containing a fluorine functional group of 3 wt %, propylene glycol methyl ether acetate (PGMEA) of 80 wt % as the solvent, photo base generator PBG A, which contains each of R1, R2 and R3 substituted with an aromatic benzene ring in the chemical formula, of 2 wt %, and dispersant E (Disp. 2 and 6) and fluorosurfactants of less than 1 wt % based on 100 parts by weight of the photosensitive composition.

COMPARATIVE EXAMPLE

Preparation of Photosensitive Composition for Black Matrix

The photosensitive composition for the black matrix was obtained by mixing and stirring at room temperatures the same components as the synthesizing example except for the photo base generator.

EXAMPLE

Forming Patterns of Black Matrix

The black matrix was formed using the photosensitive composition obtained in each of the synthesizing example and the comparative example. The photosensitive composition was dropped and spun on a transparent glass substrate in a thickness of 0.6 mm, and the substrate including the photosensitive composition was pre-baked at a temperature of 100 degrees of Celsius for 90 seconds to form a film. A photo mask with a pattern width of 6 micrometers was disposed over the film, and UV having a wavelength of 300~400 nm was irradiated to the film through the photo mask. Here, the light-exposing gap was 110 micrometers and the light-exposing amount was 30 mJ. After the light-exposing step, the film was soaked in potassium hydroxide aqueous solution, as the developing solution, for 63 seconds, and the unexposure portion of the film was removed to form patterns of the black matrix. The substrate including the patterns of black matrix was disposed in an oven and post-baked at a temperature of 230 degrees of Celsius for 20 minutes to completely cure the patterns of the black matrix.

EXPERIMENTAL EXAMPLE

Observation of Patterns of Black Matrix

Figure 4:
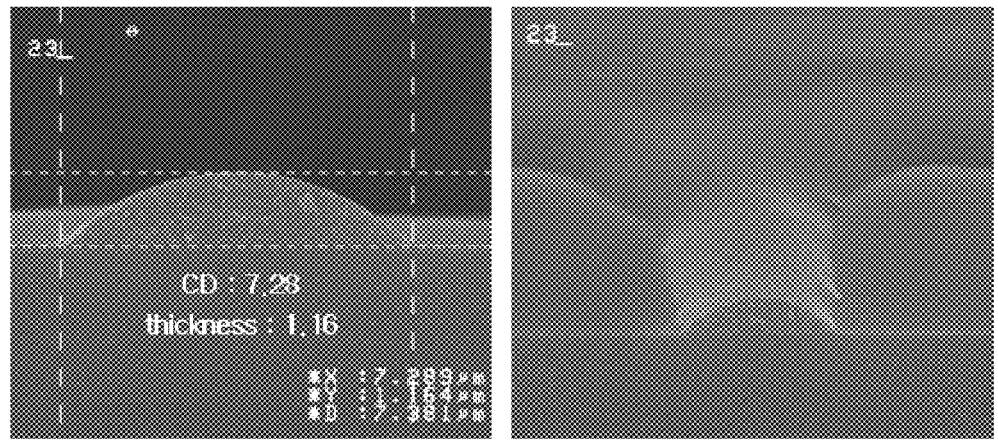
FIG. 4 and FIG. 5 are pictures of patterns of a black matrix formed of the photosensitive composition according to the comparative example in a central area and an edge area of a substrate, respectively, taken by SEM.
Figure 5:
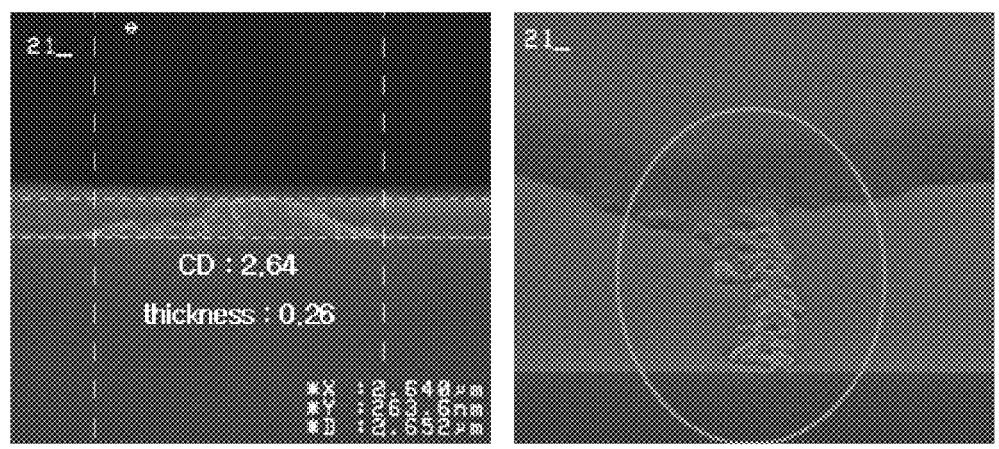
Figure 6:
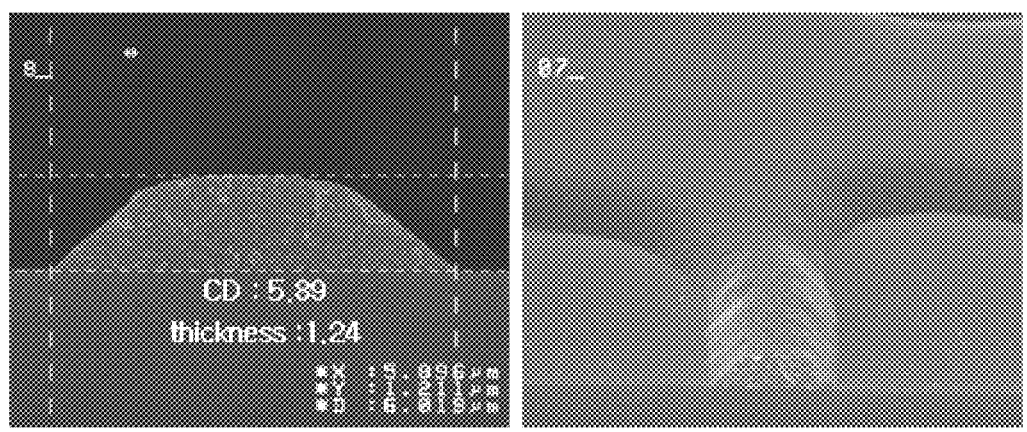
FIG. 6 and FIG. 7 are pictures of patterns of a black matrix formed of the photosensitive composition according to the synthesizing example of the present invention in a central area and an edge area of a substrate, respectively, taken by SEM.
Figure 7:
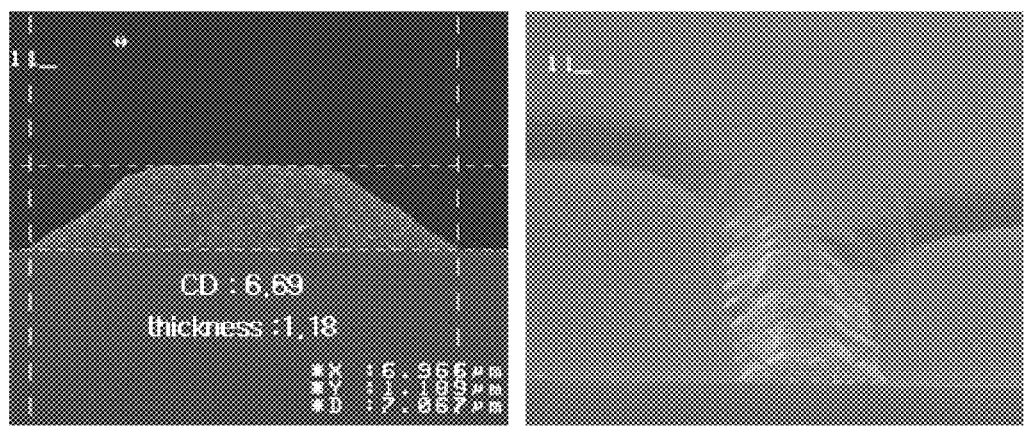

The patterns of the black matrix formed in the example were measured by a scanning electron microscope (SEM). The measuring results are shown in FIGS. 4 to 7. FIG. 4 and FIG. 5 are pictures of patterns of a black matrix formed of the photosensitive composition according to the comparative example in a central area and an edge area of a substrate, respectively, taken by SEM. FIG. 6 and FIG. 7 are pictures of patterns of a black matrix formed of the photosensitive composition according to the synthesizing example of the present invention in a central area and an edge area of a substrate, respectively, taken by SEM.

As shown in FIG. 4 and FIG. 5, the upper portion of the pattern in the edge area formed according to the comparative example, where the intensity of light is relatively low, was lost or torn out. The thickness of the pattern in the edge area was thinner than the thickness of the pattern in the central area, and the width of the pattern in the edge area was not uniform as compared with the width of the pattern in the central area.

On the other hand, as shown in FIG. 6 and FIG. 7, the upper portion of the pattern in the edge area formed according to the synthesizing example of the present invention was not lost or torn out, and the thickness of the pattern in the edge area was improved to the extent of the thickness of the pattern in the central area. In addition, the widths of the patterns in the edge area and the central area were uniform.

Meanwhile, when the black matrix formed of the photosensitive composition according to the comparative example was applied to a liquid crystal display device, the brightness was 410 nit. When the black matrix formed of the photosensitive composition according to the synthesizing example of the present invention was applied to a liquid crystal display device, the brightness was 520 nit, which was increased by 20% as compared with the comparative example. Therefore, when the photosensitive composition of the present invention is used, the black matrix having a fine pattern with a width of less than 6 micrometers can be formed. Accordingly, high definition is available, and aperture ratio is increased to obtain the high image quality.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. A photosensitive composition for forming a black matrix, comprising:
   pigment of 5~20 wt %;
   binder resin of 1~25 wt %;
   photo-polymerizable monomer of 1~25 wt %;
   photopolymerization initiator of 1~25 wt %;
   solvent of 65~85 wt %; and
   photo base generator of 1~10 wt %, based on 100 parts by weight of the photosensitive composition,
   wherein the photo base generator has a structure of a following chemical formula:

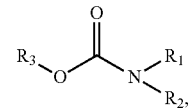

wherein each of R1, R2 and R3 is one of C3~C8 cyclo aliphatic having a hetero atom on a ring; and aryl having a hetero atom on a ring,
   wherein the aryl is unsubstituted or substituted with C1~C10 alkyl or C1~C10 alkoxy, and the aryl is selected from benzene, phenyl, naphthalene and anthracene, and
   wherein the hetero atom is an oxygen atom, a nitrogen atom and/or a sulfur atom.

2. The photosensitive composition according to claim 1, wherein photopolymerization initiator is selected from acetophenone compounds, benzophenone compounds, thioxanthone compounds, benzoin compounds, triazine compounds, oxime compounds and their combinations.

3. The photosensitive composition according to claim 1, wherein the pigment includes carbon black.

4. The photosensitive composition according to claim 1, wherein the binder resin is selected from cardo binder resin, acrylic binder resin, epoxy binder resin, and their combinations.

5. The photosensitive composition according to claim 1, wherein the photo-polymerizable monomer is selected from an acrylic monomer containing an acid functional group, an acrylic monomer containing a fluorine functional group, a monomer containing an epoxy group, a multi-functional monomer containing an ethylenic-unsaturated double bond, and their combinations.

6. The photosensitive composition according to claim 1, wherein the solvent is selected from propylene glycol methyl ether acetate (PGMEA), propylene glycol ethyl ether acetate (PGEEA), propylene glycol methyl ether (PGME), propylene glycol propyl ether (PGPE), ethylene glycol monomethyl ether acetate, ethylene glycol monoethyl ether acetate, ethylene glycol monobutyl ether acetate, ethylene glycol monomethyl ether, ethylene glycol monoethyl ether, diethylene glycol methyl acetate, dipropylene glycol methyl ether, methyl ethoxy propionate, ethyl ethoxy propionate, ethyl acetate, butyl acetate, cyclo-hexanone, acetone, methyl isobutyl ketone, dimethyl formamide, N,N'-dimethyl acetamide, N-methyl pyrrolidone, toluene, and their combinations.

7. A method of forming a black matrix, comprising:
forming a film by applying a photosensitive composition to a substrate, wherein the photosensitive composition includes pigment of 5~20 wt %, binder resin of 1~25 wt %, photo-polymerizable monomer of 1~25 wt %, photopolymerization initiator of 1~25 wt %, solvent of 65~85 wt %, and photo base generator of 1~10 wt %, based on 100 parts by weight of the photosensitive composition;
disposing a photo mask over the film and irradiating light to the film through the photo mask such that a photo-polymer is formed;
developing the film including the photo-polymer using a developing solution to form a pattern; and
baking the pattern.

8. The method according to claim 7, wherein the photo base generator has a structure of a following chemical formula:

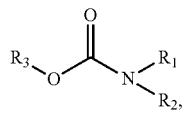

wherein each of R1, R2 and R3 is one of C1~C10 alkyl having a hetero atom; C3~C8 cyclo aliphatic having a hetero atom on a ring; and aryl having a hetero atom on a ring, wherein the aryl is unsubstituted or substituted with C1~C10 alkyl or C1~C10 alkoxy, and the aryl is selected from benzene, phenyl, naphthalene and anthracene, and wherein the hetero atom is an oxygen atom, a nitrogen atom and/or a sulfur atom.

9. The method according to claim 7, wherein the light has a wavelength within a range of 300-400 nm.

10. The method according to claim 7, wherein a portion of the film not exposed to light is removed after developing the film.

11. The method according to claim 7, wherein the developing solution includes potassium hydroxide.

12. The method according to claim 7, further comprising pre-baking the film before disposing the photo mask over the film.

13. A method of fabricating a color filter substrate, comprising:
forming a film by applying a photosensitive composition to a substrate, wherein the photosensitive composition includes pigment of 5~20 wt %, binder resin of 1~25 wt %, photo-polymerizable monomer of 1~25 wt %, photopolymerization initiator of 1~25 wt %, solvent of 65~85 wt %, and photo base generator of 1~10 wt %, based on 100 parts by weight of the photosensitive composition;
disposing a photo mask over the film and irradiating light to the film through the photo mask such that a photo-polymer is formed;
developing the film including the photo-polymer using a developing solution to form a pattern;
baking the pattern to form a black matrix; and
forming a color filter layer on the substrate exposed by the black matrix.

14. The method according to claim 13, wherein forming the color filter layer includes injecting ink on the substrate exposed by the black matrix.

15. The method according to claim 13, wherein forming the color filter layer includes applying, light-exposing, developing and curing color resist.

16. The method according to claim 13, wherein the photo base generator has a structure of a following chemical formula:

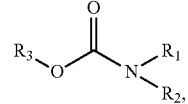

wherein each of R1, R2 and R3 is one of C1~C10 alkyl having a hetero atom; C3~C8 cyclo aliphatic having a hetero atom on a ring; and aryl having a hetero atom on a ring, wherein the aryl is unsubstituted or substituted with C1~C10 alkyl or C1~C10 alkoxy, and the aryl is selected from benzene, phenyl, naphthalene and anthracene, and wherein the hetero atom is an oxygen atom, a nitrogen atom and/or a sulfur atom.

* * * * *